Figure 1:
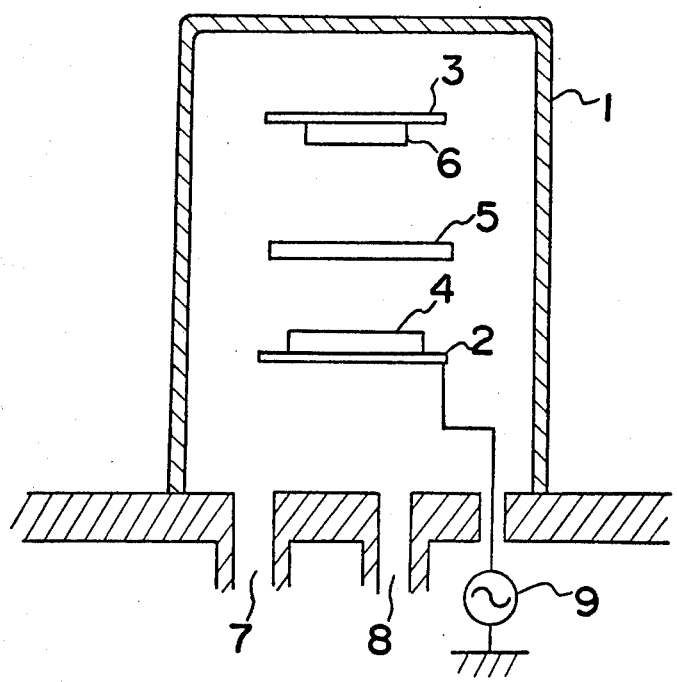

United States Patent [19]

Ogawa et al.

[11] 4,139,678

[45] Feb. 13, 1979

[54] PIEZOELECTRIC CRYSTALLINE FILMS AND METHOD OF PREPARING THE SAME

[75] Inventors: Toshio Ogawa; Tasuku Mashio, both of Nagaokakyo; Hiroshi Nishiyama, Mukou, all of Japan

[73] Assignee: Murata Manufacturing Co., Ltd., Kyoto, Japan

[21] Appl. No.: 874,391

[22] Filed: Feb. 2, 1978

[30] Foreign Application Priority Data

Feb. 2, 1977 [JP] Japan ................................. 52-11059

[51] Int. Cl.$^2$ ....................... C23C 15/00; C04B 35/00
[52] U.S. Cl. .............................. 428/432; 204/192 SP; 252/62.9; 427/100; 428/469; 428/539
[58] Field of Search ................. 252/62.9; 204/192 SP; 427/100; 428/432, 469, 539

[56] References Cited

U.S. PATENT DOCUMENTS

| | | | |
|---|---|---|---|
| 3,470,100 | 9/1969 | Ballman | 252/62.9 |
| 3,766,041 | 10/1973 | Wasa et al. | 252/62.9 |
| 3,988,232 | 10/1976 | Wasa et al. | 204/192 SP |

OTHER PUBLICATIONS

Pettsold et al. "Chem. Abstracts", vol. 83, 1975, 186967n.
Mikio et al. "Chem Abstracts", vol. 81, 1974, 128704.
Iga et al. "Chem. Abstracts", vol. 85, 1976, 82363n.

*Primary Examiner*—Jack Cooper
*Attorney, Agent, or Firm*—Birch, Stewart, Kolasch and Birch

[57] ABSTRACT

Piezoelectric crystalline films which consist essentially of a crystalline zinc oxide film with a c-axis perpendicular to a substrate surface, containing 0.01 to 20.0 atomic percent of bismuth. These films are prepared by radio-frequency sputtering.

4 Claims, 1 Drawing Figure

PIEZOELECTRIC CRYSTALLINE FILMS AND METHOD OF PREPARING THE SAME

BACKGROUND AND SUMMARY OF THE INVENTION

The present invention relates to piezoelectric crystalline films. More particularly, it relates to piezoelectric crystalline films comprising zinc oxide having a hexagonal crystal structure.

There are many methods for making piezoelectric zinc oxide films such as, for example, vacuum deposition methods, epitaxial growth methods, and sputtering methods. Among these methods, the sputtering methods, particularly, a radio-frequency sputtering method has been used very often lately because of the advantage that the growing rate of oriented crystalline films is high, thus making it possible to mass-produce piezoelectric crystalline films, industrially.

When making a piezoelectric crystalline film of zinc oxide on a substrate surface by the radio-frequency sputtering method, ceramics of highly pure zinc oxide has been conventionally used as a source of film material. However, even when radio-frequency sputtering is effected with such a film material source, it is difficult to make piezoelectric crystalline films with a c-axis perpendicular to the substrate surface. If the c-axis of the zinc oxide film is inclined with respect to the axis perpendicular to the substrate surface, the value of the electromechanical coupling factor becomes small, thus making it difficult to produce a piezoelectric crystalline film transducer with good conversion efficiency.

It has now been found that the use of ceramics of zinc oxide containing bismuth makes it possible to produce a piezoelectric crystalline film with a c-axis perpendicular to the substrate surface and with high quality.

It is an object of the present invention to provide an improved zinc oxide piezoelectric crystalline film which overcomes the aforesaid disadvantages.

According to the present invention, there is provided a piezoelectric crystalline film of zinc oxide with a c-axis perpendicular to the substrate surface, characterized in that said crystalline film contains 0.01 to 20.0 atomic percent of bismuth.

The piezoelectric crystalline film of the present invention may be made by any conventional methods such as for example, the radio-frequency sputtering methods, the co-sputtering methods and the ion plating methods.

The present invention will be further apparent from the following description with respect to examples and the accompanying drawing, in which:

FIG. 1 is a diagrammatic view of the radio-frequency sputtering apparatus used for making piezoelectric crystalline films according to the present invention.

Referring now to FIG. 1, there is shown a radio-frequency sputtering apparatus with two electrodes which is used for making piezoelectric crystalline films according to the present invention. The apparatus comprises a bell jar 1 in which a pair of electrodes, i.e., a planar cathode 2 and a planar anode 3 are positioned in parallel. Fixed on the cathode 2 is a film material source 4 consisting essentially of ceramics of zinc oxide containing bismuth. A shutter 5 is positioned between electrodes 2 and 3. A substrate 6 of glass or metal is fixed to the bottom of the anode 3. The substrate 6 is heated to a temperature of 200° to 500° C., during sputtering. A ventage 7 and a gas inlet 8 are provided to the bell jar 1.

The radio-frequency sputtering is effected in the following manner: After making airtight, the bell jar 1 is evacuated through the ventage 7 to a pressure not higher than $1 \times 10^{-6}$ Torrs, and then supplied with argon or oxygen gas or a mixed gas of argon and oxygen through the gas inlet 8 whereby adjusting the pressure to $1 \times 10^{-1}$ to $1 \times 10^{-3}$ Torrs. A radio-frequency voltage is applied between the cathode 2 and the bell jar 1 by the radio-frequency electric power source 9. An electric power of 2 to 8 W/cm² is supplied to the film material source 4.

The film material source consisting essentially of ceramics of zinc oxide containing bismuth is prepared in the following manner:

Using powder of ZnO and $Bi_2O_3$ as raw materials, there are prepared mixtures each having a compositional proportion shown in Table 1. Each of the mixtures is milled by the wet process, dried and then presintered at 600 to 800° C. for 2 hours. The presintered body is crushed, milled by the wet process with an organic binder and then dried. The resultant powder is shaped into discs with a diameter of 100 mm and a thickness of 5 mm at a pressure of 1000 kg/cm² and then fired at 1200° C. for 2 hours to obtain film material sources.

The thus obtained film material sources were subjected to measurements of percentage of bulk density $d_s$ to theoretical density $d_t$ ($d_s/d_t \times 100$). The results as obtained are shown in Table 1.

Table 1

| Specimen No. | Additive (atom %) Bi | Material source $d_s/d_t \times 100$ (%) | Zinc oxide film Orientation (x) (deg.) | Adhesion |
|---|---|---|---|---|
| 1 | — | 85 | 5.8 | bad |
| 2 | 0.01 | 93 | 1.8 | good |
| 3 | 1.0 | 95 | 0.9 | " |
| 4 | 10.0 | 96 | 0.2 | " |

Using the respective film material sources obtained, zinc oxide piezoelectric crystalline films are made on glass substrates with the aforesaid radio-frequency sputtering apparatus. The radio-frequency sputtering is carried out under the following conditions: A mixed gas of 90 vol% of argon and 10 vol% of oxygen is supplied to the bell jar 1 through the gas inlet 8, whereby adjusting the pressure in the bell jar 1 to $2 \times 10^{-3}$ Torrs. The glass substrate is heated to and kept at 350° C. The film material source 4 is supplied 6 W/cm² of an electric power with a frequency of 13.56 MHz.

The c-axis orientation of thus obtained piezoelectric crystalline films was measured with a locking curve method by X-ray diffraction (Ref.: Minakata, Chubachi and Kikuchi "Quantitative Representation of c-axis Orientation of Zinc Oxide Piezoelectric Thin Films" The 20th Lecture of Applied Physics Federation (Japan). vol. 2 (1973) page 84; and Makoto Minakata, The Tohoku University Doctor's Thesis (1974)). The mean value ($\bar{X}$) of the angle of the c-axis with respect to the axis perpendicular to the substrate surface were obtained from respective specimens. The results of the measurement of the adhesion of the film to the substrate are also shown in Table 1. The experiment to determine whether or not the film has sufficient adhesive force was carried out by the thermal shock test method 107C of MIL-STD-202D. A film peeled off from the surface of the substrate was judged as "bad" and, a film which shows no change was judged as "good".

As is evident from Table 1, the crystalline films of the present invention have a c-axis having an angle not more than 2 degrees with prespect to the axis perpendicular to the substrate surface, i.e., a c-axis approximately perpendicular to the substrate surface. This means that according to the present invention it is possible to produce excellent piezoelectric crystalline films with a large electromechanical coupling factor. Also, it will be seen that the crystalline films of the present invention possess good adhesion.

In the above examples, bismuth is used in the oxide form, but any other form such as metal, compounds or alloys thereof may be used as a raw material for preparing film material source. In such cases, the same results can be obtained if bismuth be contained in the resultant zinc oxide piezoelectric crystalline film. The concentration of bismuth in the sputtered zinc oxide films according to the present invention ranges from 0.01 to 20.0 atomic percent. Because, if the concentration of bismuth is less than 0.01 atomic percent, the adhesion of the resultant crystalline films to the substrates changes for the worse, and if the concentration of bismuth is more than 20.0 atomic percent, the direction of the crystallographic orientation of the zinc oxide films can not be well controlled, resulting in the change for the worse in the orientation of the zinc oxide films.

It has been found that by the use of the film material source containing bismuth the following advantages can be obtained.

When mass-producing piezoelectric crystalline films industrially by the radio-frequency sputtering methods, it is necessary to increase the growing rate of crystalline film. In such case, the electric power supplied to the film material source per unit area thereof must be increased so that it is required to have a high bulk density. This requirement is fully met by the film material source containing bismuth. As is evident from Table 1, the film material source used in the present invention have a bulk density higher than the conventionally used ones so that the film material source containing bismuth make it possible to mass-produce zinc oxide piezoelectric crystalline films by the use of high electric powers.

What is claimed is:

1. A piezoelectric crystalline film disposed on a substrate, said film consisting essentially of a crystalline zinc oxide film with a hexagonal crystal structure and a c-axis substantially perpendicular to the substrate surface, characterized in that said crystalline zinc oxide film contains 0.01 to 20.0 atomic percent of bismuth.

2. The piezoelectric crystalline film of claim 1, wherein the substrate is selected from the group consisting of metal and glass.

3. A method for making piezoelectric crystalline films comprising simultaneously sputtering zinc oxide and bismuth from a film material source onto a metal or glass substrate to form a crystalline zinc oxide film with a hexagonal crystal structure and a c-axis substantially perpendicular to the substrate surface containing 0.01 to 20.0 atomic percent of bismuth, wherein said sputtering is effected by radio-frequency sputtering in an atmosphere of argon or oxygen, or a mixture of argon and oxygen under a pressure of $1 \times 10^{-1}$ to $1 \times 10^{-3}$ Torr, and wherein said film material source consists essentially of ceramics of zinc oxide containing 0.01 to 20.0 atomic percent of bismuth, said substrate being positioned on an anode placed in parallel with a cathode on which said film material source is positioned, said film material source being supplied with an electric power of 2 to 8 w/cm$^2$.

4. The method for making piezoelectric crystalline films according to claim 3, wherein the substrate is heated to a temperature of 200 to 500° C. during sputtering.

* * * * *